United States Patent [19]

Shibata et al.

[11] 4,449,234

[45] May 15, 1984

[54] REVERBERATION APPARATUS

[75] Inventors: Takashi Shibata, Kamakura; Masaaki Nishimura, Tokyo, both of Japan

[73] Assignee: Sony Corporation, Tokyo, Japan

[21] Appl. No.: 346,110

[22] Filed: Feb. 5, 1982

[30] Foreign Application Priority Data

Feb. 13, 1981 [JP] Japan .................................. 56-19803

[51] Int. Cl.³ ............................................ H03H 9/125

[52] U.S. Cl. ........................................ 381/65; 381/63

[58] Field of Search .................... 179/1 GP, 1 J, 1 D, 179/1 F; 333/146; 84/DIG. 26; 381/19, 61, 62, 63, 64, 65, 96, 98, 101

[56] References Cited

U.S. PATENT DOCUMENTS

| | | | |
|---|---|---|---|
| 2,967,447 | 1/1961 | Hanert | 179/1 J |
| 3,185,767 | 5/1965 | Olson et al. | 179/1 J |
| 3,587,006 | 6/1971 | Weingartner | 179/1 J X |
| 3,761,629 | 9/1973 | Suzuki et al. | 179/1 J |
| 3,988,541 | 10/1976 | Boast | 179/1 D |
| 4,295,006 | 10/1981 | Tanaka et al. | 179/1 D X |

*Primary Examiner*—G. Z. Rubinson
*Assistant Examiner*—Keith E. George
*Attorney, Agent, or Firm*—Hill, Van Santen, Steadman & Simpson

[57] ABSTRACT

A reverberation apparatus includes a signal input terminal to be supplied with an input signal, an operational amplifier having an inverted input terminal, a non-inverted input terminal, and an output terminal. The inverted input terminal is connected to the signal input terminal through an input impedance circuit. The non-inverted input terminal is connected to a reference point, and the output terminal is connected to the reference point through an inductance circuit as a load and a first impedance circuit. A second impedance circuit is connected between the inverted input terminal of the operational amplifier and the connection point between the inductance circuit and the first impedance circuit. In this circuit, the inductance circuit functions as a drive circuit of the reverberation apparatus.

9 Claims, 8 Drawing Figures

REVERBERATION APPARATUS

BACKGROUND OF THE INVENTION

1. Field of the Invention

The present invention relates generally to a reverberation apparatus, and is directed more particularly to a reverberation apparatus in which the frequency band of a reverberation sound is expanded.

2. Description of the Prior Art

A reverberation apparatus, which is widely known in the art, will be explained with reference to the graph of FIG. 1. In the prior art reverberation apparatus, a constant voltage type (in which the ratio between input and output voltages, or a so-called voltage amplifying factor, is constant regardless of frequency) is generally used as a driving amplifier. An original is supplied through the driving amplifier to a converter of a moving magnet type, and a spring is driven by the vibration of a magnet in the converter.

However, the impedance of a coil provided in the converter is substantially j ω L (ω is the frequency of the original signal flowing through the coil and L is the inductance of the coil), and increases substantially in proportion to the frequency of the original signal as shown in the graph of FIG. 1.

Accordingly, in a high frequency band where the impedance of the coil increases, the current flowing through the coil is decreased. Since the driving force for the spring is in proportion to the current flowing through the coil if the other conditions are constant, the high frequency band characteristic of the reverberation sound provided by the prior art reverberation apparatus in which the constant voltage type driving amplifier is connected to the coil, is deteriorated.

To avoid this defect, in the prior art an arrangement is proposed in which a resistor having a high resistance value is located at the stage prior to the coil in the converter, and the output signal from the driving amplifier is supplied to the series circuit of the coil and the resistor. In this manner, the variation accompanied by the frequency of the current flowing through the coil can be reduced.

However, in order to make the current variation as small as possible, it is necessary to increase the resistance value of the resistor indefinitely. If the resistance value of the resistor is increased as set forth above, the current flowing through the coil is reduced, which results in the driving force for the spring being decreased.

OBJECTS AND SUMMARY OF THE INVENTION

Accordingly, an object of the present invention is to provide a reverberation apparatus free from the defects inherent in the prior art.

Another object of the present invention is to provide a novel reverberation apparatus in which, while the clamping factor is kept small, the high frequency band characteristic of reverberation sound is prevented from being deteriorated.

According to an aspect of the present invention there is provided a reverberation apparatus which comprises: a signal input terminal to be supplied with an input signal; an operational amplifier having an inverted input terminal, a non-inverted input terminal, and an output terminal, the inverted input terminal being connected to the signal input terminal through an input impedance, the non-inverted terminal being connected to a reference point, the output terminal being connected to the reference point through an inductance as a load and a first impedance; and a second impedance connected between the inverted input terminal of the operational amplifier and the connection point between the inductance and the first impedance. In this circuit, the inductance is applicable as a driver for the reverberation apparatus.

Other objects, features and advantages of the present invention will become apparent from the following description taken in conjunction with the accompanying drawings through which like reference numerals designate the same elements and parts.

DESCRIPTION OF THE PREFERRED EMBODIMENT

An example of the reverberation apparatus of a spring type according to the present invention will be hereinafter described with reference to FIGS. 2 through 6.

Figure 1:
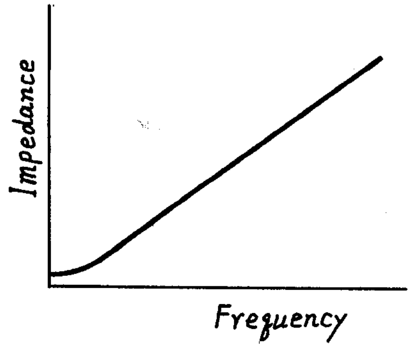
FIG. 1 (PRIOR ART)
FIG. 1 is a graph used to explain a prior art reverberation apparatus.
Figure 2:
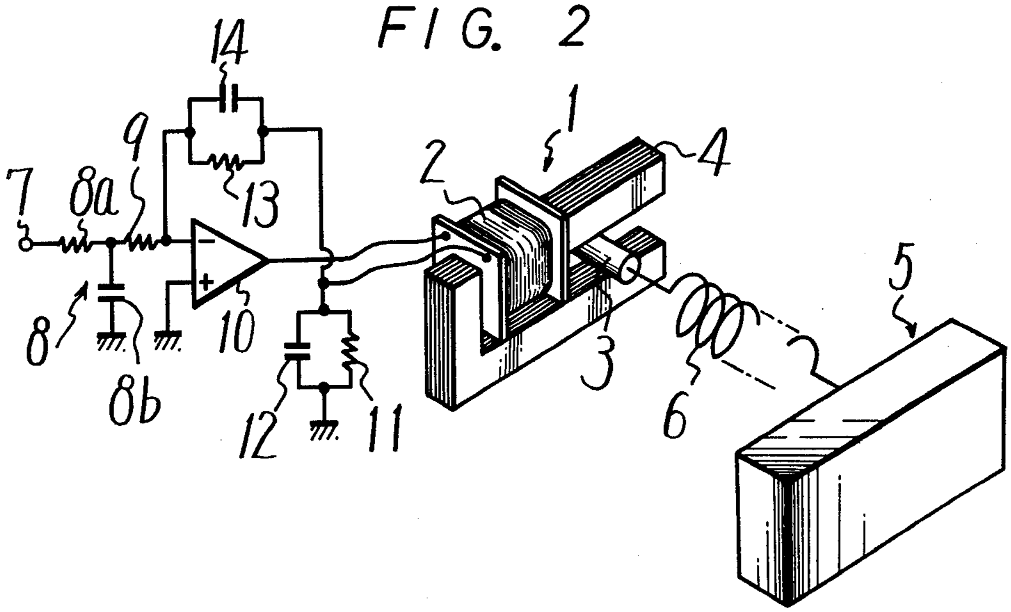
FIG. 2 is a schematic circuit connection diagram showing an embodiment of the reverberation apparatus according to the present invention.
Figure 3:
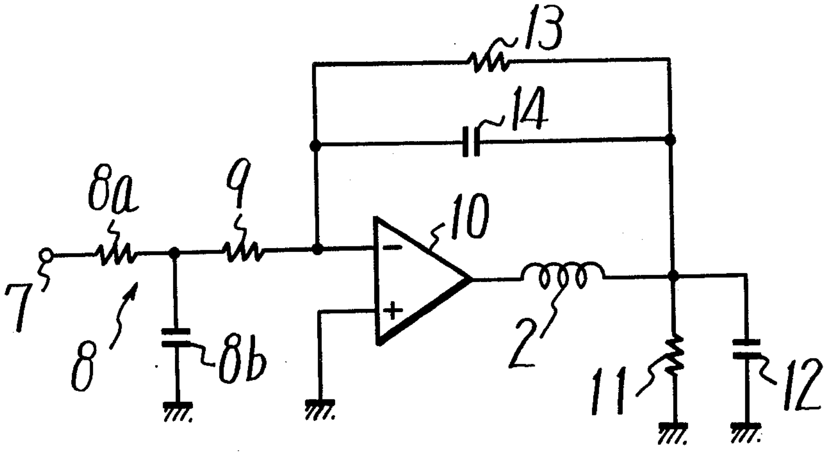
FIG. 3 is a circuit diagram depicting the essential part of the embodiment shown in FIG. 2.

In FIGS. 2 and 3, which show an example of the invention, reference numeral 1 generally designates a first converter or transducer at the drive side which is formed of a coil 2, a magnet 3, and a yoke 4. The structure of this converter 1 is well known.

At the pick-up side, a second converter or transducer 5 is provided which is formed similar to the transducer 1 at the drive side. A spring 6 is mechanically coupled, at both ends thereof, to the magnet 3 of the transducer 1 at the drive side and the magnet (not shown) of the transducer 5 at the pick-up side, respectively.

An original signal applied to an original signal input terminal 7 is supplied through a low pass filter 8, consisting of a resistor 8*a* and a capacitor 8*b*, and a resistor 9 to the inverted input terminal of an operational amplifier 10 whose non-inverted input terminal is grounded. The output terminal of the operational amplifier 10 is connected to one end of the coil 2, whose other end is grounded through the parallel connection of a resistor 11 and a capacitor 12 and also connected to the inverted input terminal of the operational amplifier 10 through another parallel circuit of a resistor 13 and a capacitor 14.

Figure 4:
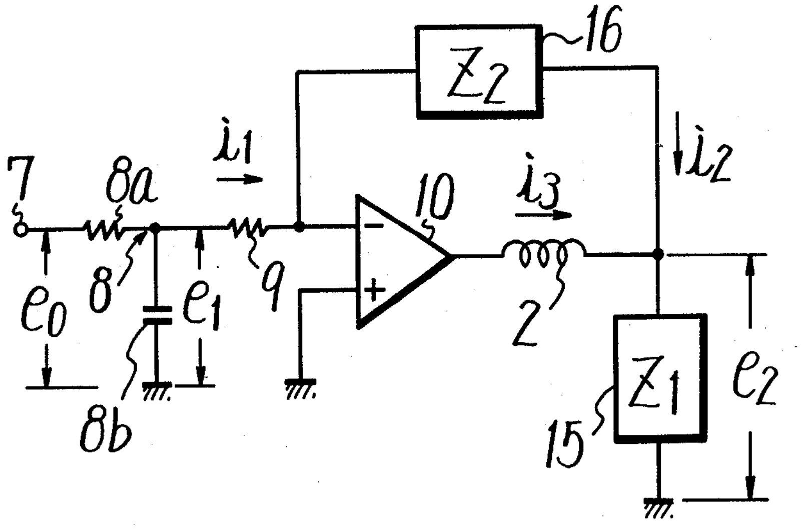
FIG. 4 is a circuit diagram used for explaining the theory of the circuit shown in FIG. 3.

FIG. 4 is a circuit diagram used to explain the theory of this invention, and in which the parts corresponding to those of FIG. 3 are marked with the same references.

In the figure, an impedance element 15 corresponds to the parallel circuit consisting of the resistor 11 and the capacitor 12 in FIG. 3, and its impedance is taken as $Z_1$. Another impedance element 16 corresponds to the parallel circuit of the resistor 13 and the capacitor 14 in FIG. 3, and its impedance is taken as $Z_2$. In this case, as shown in FIG. 4 it is assumed that the reference voltage is taken as ground, the voltage of the original signal applied to the input terminal 7 as $\rho_0$, the output voltage from the low pass filter 8 as $\rho_1$, the voltage appearing at one end of the coil 2 whose other end is connected to the output terminal of the operational amplifier 10 as $\rho_2$, the current flowing through the resistor 9 as $i_1$, the current flowing through the impedance element 16 as $i_2$, the current flowing through the coil 2 as $i_3$, and the resistance value of the resistor 9 as $R_0$, respectively. If there is no difference between the voltages at the inverted and non-inverted input terminals of the operational amplifier 10, and the input impedance to the inverted input terminal of the operational amplifier 10 is very high, the following equations (1) to (4) are respectively established:

$$\rho_1 = R_0 \cdot i_1 \tag{1}$$

$$O = Z_2 \cdot i_2 + \rho_2 \tag{2}$$

$$\rho_2 = Z_1(i_2 + i_3) \tag{3}$$

$$i_1 = i_2 \tag{4}$$

From the above equations (1) to (4), the current $i_3$ can be expressed as follows:

$$i_3 = -\frac{1}{R_0}\left(1 + \frac{Z_2}{Z_1}\right)\rho_1 \tag{5}$$

Turning back to FIG. 3, in order to make the equation (5) applicable to the example of FIG. 3 or FIG. 2, the impedances $Z_1$ and $Z_2$ of the impedance elements 15 and 16 must be expressed as follows:

$$Z_1 = \frac{R_1}{1 + j\omega C_1 \cdot R_1}$$

$$Z_2 = \frac{R_2}{1 + j\omega C_2 \cdot R_2}$$

Thus, the equation (5) can be rewritten as follows:

$$i_3 = -\frac{1}{R_0}\left(1 + \frac{R_2}{R_1} \cdot \frac{1 + j\omega C_1 \cdot R_1}{1 + j\omega C_2 \cdot R_2}\right)\rho_1 \tag{6}$$

where $R_1$ and $R_2$ are the resistance values of the resistors 11 and 13, $C_1$ and $C_2$ are the capacitance values of the capacitors 12 and 14, and $\omega$ is the frequency of the original signal respectively.

If the low pass filter 8 is taken into consideration, the current $i_3$ flowing through the coil 2 can be expressed as follows:

$$i_3 = -\frac{1}{R_0}\left(1 + \frac{R_2}{R_1} \cdot \frac{1 + j\omega C_1 \cdot R_1}{1 + j\omega C_2 \cdot R_2}\right)\frac{\rho_0}{1 + j\omega C_3 \cdot R_3} \tag{7}$$

where $R_3$ is the resistance value of the resistor 8a, and $C_3$ is the capacitance value of the capacitor 8b. Resistor 8a and capacitor 8b form the low pass filter 8 as set forth previously.

Figure 6:
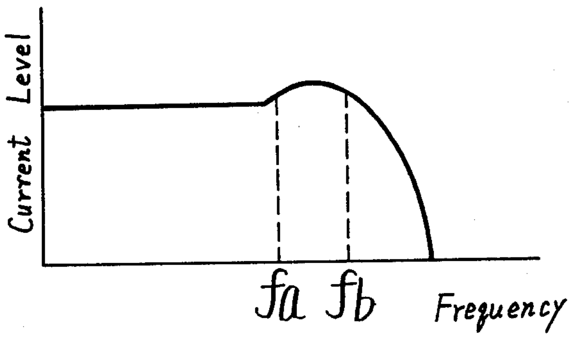
FIG. 6 is a graph used for the explanation of the circuit shown in FIG. 3.

In this case, if the respective constants in the equation (7) are suitably selected, the current $i_3$ flowing through the coil 2 can be set to have the frequency characteristic as shown in the graph of FIG. 6.

Figure 5:
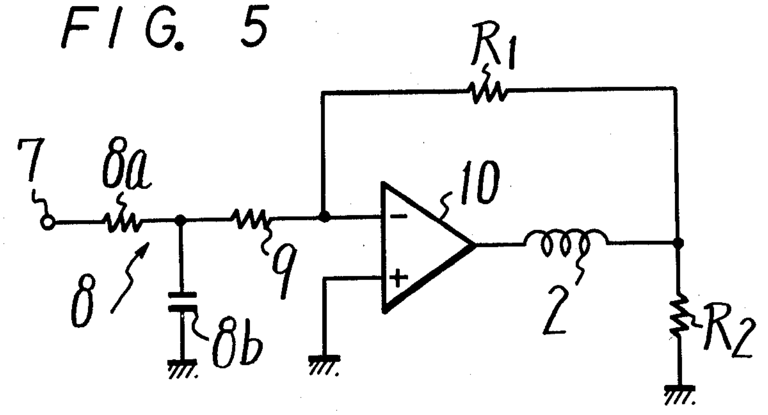
FIG. 5 is a circuit diagram used to explain the quality of the circuit shown in FIG. 3.

In order to simplify the explanation, a circuit in which resistors are used as the impedance elements will be described with reference to FIG. 5. Since in FIG. 5 pure resistors $R_2$ and $R_1$ are respectively used as the impedance elements $Z_1$ and $Z_2$ in the example of FIG. 4, from the equation (5) the current $i_3$ is expressed as follows:

$$i_3 = -\frac{1}{R_0}\left(1 + \frac{R_2}{R_1}\right)\rho_1 \tag{8}$$

In this case, if the voltage of the original signal is constant regardless of its frequency, equation (8) represents the fact that the current $i_3$ flowing through the coil 2 is determined by the resistance value $R_0$ of the resistor 9 and those of the pure resistors $R_1$ and $R_2$. Accordingly, the linearity of the flat portion of the frequency characteristic of the current flowing through the coil 2 (the linearity of the portion somewhat lower than the lower cut-off frequency $f_a$) shown in the graph of FIG. 6 is caused by the resistive components of the resistor 9 and the pure resistors $R_1$ and $R_2$.

The rise of the frequency characteristic of the current flowing through the coil 2 shown in FIG. 6 before and after or near the lower cut-off frequency $f_a$ is caused by the parallel circuit of the resistor 11 and the capacitor 12. The cut-off frequency $f_a$ is, for example, 1 KHz and is determined by the constants of the resistor 11 and the capacitor 12.

The decrease near the upper cut-off frequency $f_b$ is generated by the other parallel circuit of the resistor 13 and capacitor 14. The upper cut-off frequency $f_b$ is, for example, 5 KHz and determined by the constants of the resistor 13 and capacitor 14.

According to the construction of the invention mentioned above, since the coil 2 is driven by constant current over the frequency band up to a frequency band lower than the lower cut-off frequency $f_a$, the frequency band of the reverberation sound can be expanded to a relatively high frequency band. Furthermore, since the damping factor is very small, the braking for the vibration of the magnet 3 is ineffective. As a result, a feeling is developed by one listening that the reverberation time is expanded.

Further, with this invention, in the vicinity of the lower cut-off frequency $f_a$, more current flows through the coil 2 as the frequency band becomes higher in consideration of the mechanical vibration system such as the magnet 3 and the spring 6. In other words, since the mass of the magnet 3 and the spring 6 (which mass corresponds to the inductance of the electrical vibration system) is large, the mechanical vibration becomes lower at the high frequency band, which can be compensated for by the above fact.

The frequency characteristic falls gently near the upper cut-off frequency $f_b$ so as to reduce the level of a noise generating source which is caused by the fact that the signal of the high frequency band is radiated in air as an electromagnetic wave which is apt to penetrate into the coil of the converter 5 at the pick-up side.

Figure 7:
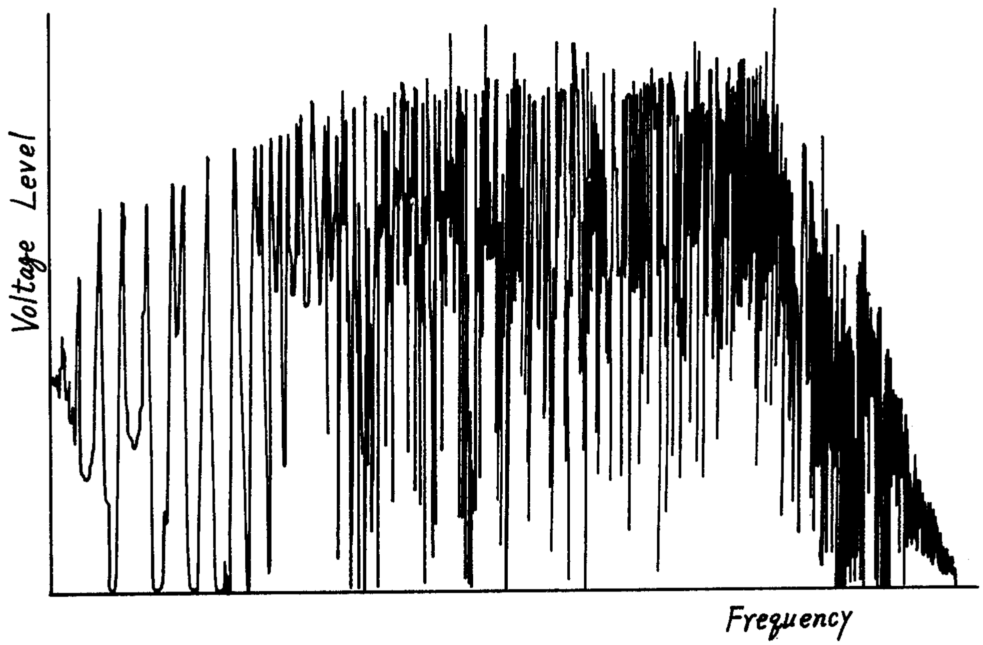
FIG. 7 is a graph showing the frequency characteristic of a reverberation sound used to explain the example of the invention shown in FIG. 2.

FIG. 7 is a graph illustrating the frequency characteristic of the reverberation sound obtained by experiments where a sinusoidal wave is supplied to the input terminal 7 of the example shown in FIG. 2 and the signal is derived from the converter at the pick-up side. It will be understood from the result of the experiments that the frequency characteristic of the voltage at the coil 2 and as shown in the graph of FIG. 6 is obtained by the example of FIG. 2.

Figure 8:
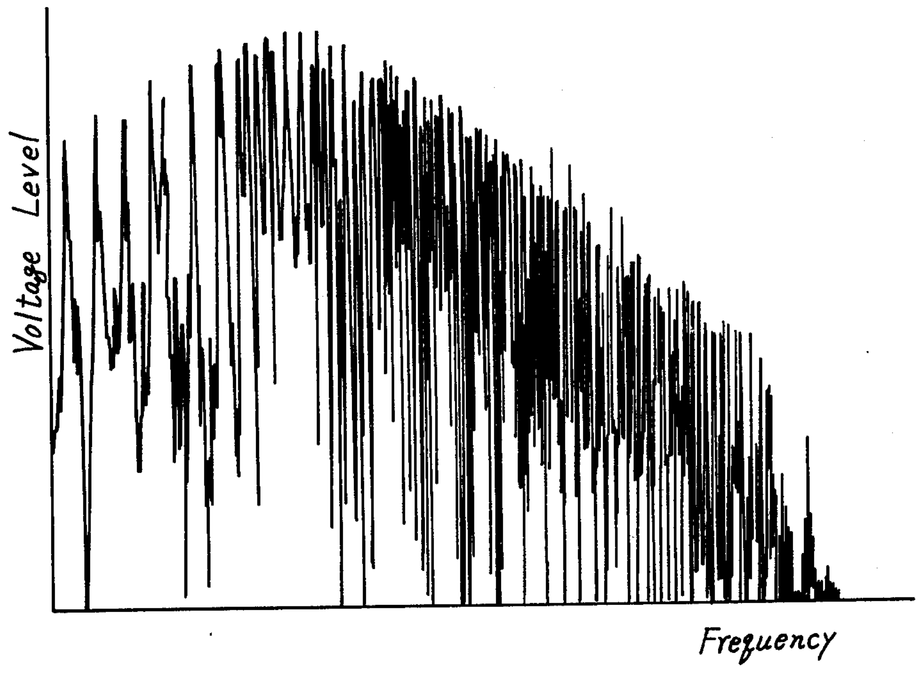
FIG. 8 (PRIOR ART)
FIG. 8 is a graph illustrating the frequency characteristic of a reverberation sound used to explain an example of a prior art constant voltage driving circuit.

For the sake of comparison, the frequency characteristic of the reverberation sound, which is obtained in the case where only the prior art constant voltage drive circuit is used and which is obtained by experiments, is shown in the graph of FIG. 8.

As may be apparent from the comparison of the graphs of FIGS. 7 and 8, the characteristic is not deteriorated in the high frequency band by this invention as compared with the prior art. Furthermore, with this invention, the reverberation sound is suppressed sufficiently if the frequency exceeds a certain frequency. This means that a current with the frequency higher than a certain frequency does not flow through the coil 2 and hence the coil 2 radiates no high frequency noise.

As set forth above, according to the spring type reverberation apparatus of this invention, the coil 2 of the converter 1 is inserted into the feedback loop of the operational amplifier 10 and the coil 2 is driven in the manner of a constant current, so that the frequency band of the reverberation sound can be expanded to the high frequency band. Also, since the damping factor is small, long reverberation time can be presented.

According to the above example of this invention, since the frequency characteristic of the current flowing through the coil 2 is raised near the lower cut-off frequency $f_a$ as shown in the graph of FIG. 6, the decrease at a higher frequency band accompanied by the mechanical vibration can be sufficiently compensated for.

Furthermore, in this invention, the frequency characteristic of the current flowing through the coil 2 falls in the vicinity of the upper cut-off frequency $f_b$ as the frequency goes in higher as shown in the graph of FIG. 6, so that there is a reduction of the high frequency noise which penetrates into the coil of the converter 5 at the pick-up side, and hence the S/N ratio is improved.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A reverberation apparatus, comprising:

a signal input terminal to be supplied with an input signal;

an operational amplifier having an inverted input terminal, a non-inverted input terminal and an output terminal, said inverted input terminal being connected to said signal input terminal through an input impedance, said non-inverted input terminal being connected to a reference point, said output terminal being connected to the reference point through an inductance as a load for the circuit and a first impedance;

a second impedance connected between the inverted input terminal of said operational amplifier and the connection point between said inductance and said first impedance, said inductance being connected such that it functions as a drive means of the reverberation apparatus;

said reverberation apparatus having a substantially flat frequency response from zero to a first cut-off frequency, a hump-shaped rising and then falling frequency characteristic from the first cut-off frequency determined by the first impedance to a higher second cut-off frequency determined by the second impedance, and a continued substantial fall-off at higher frequencies above the second cut-off frequency;

said first impedance being chosen to provide said rising frequency response near the first cut-off frequency; and said second impedance being chosen to provide the falling frequency response near said second cut-off frequency, whereby a frequency band of a reverberation sound produced by the apparatus is expanded to a relatively high frequency band and a damping factor remains relatively small, while near the upper cut-off frequency the falling response reduces a level of electromagnetic noise being generated.

2. A reverberation apparatus according to claim 1 in which each of said first and second impedances comprises a resistance.

3. A reverberation apparatus according to claim 1 in which each of said first and second impedances comprises a parallel connection circuit of a resistance and a condenser.

4. A reverberation apparatus according to claim 1 in which during operation of the circuit, a current flowing through said inductance is substantially a constant current.

5. A reverberation apparatus according to claim 1 further including an electromagnetic drive transducer, an electromagnetic pickup transducer, and a spring connecting the transducers to one another.

6. A reverberation apparatus according to claim 5 wherein each of the transducers has a coil, a yoke, and a magnet associated therewith.

7. A reverberation apparatus according to claim 6 in which the coil of the drive transducer forms the inductance.

8. A reverberation apparatus according to claim 7 in which the magnet of the drive transducer is coupled to the magnet of the pickup transducer by said spring.

9. A reverberation apparatus, comprising: an electromagnetic drive transducer; an electromagnetic pickup transducer; each of the transducers having an inductance, a core, and a movable magnet associated therewith; a spring coupling the two movable magnets to one another; a signal input; an operational amplifier having inverting and non-inverting inputs; a low pass filter connecting the signal input to the inverting input and the non-inverting input being coupled to a reference point; an output of the operational amplifier connecting through the inductance of the drive transducer through a first impedance comprising a parallel resistance and capacitance to the reference point; a second impedance comprising a parallel resistance and capacitance having one end connected to the junction between the first impedance and said inductance of the drive transducer and the other end connecting to the inverting input, the inductance of the drive transducer connected to the operational amplifier functioning as a drive means of the reverberation apparatus; said reverberation apparatus having a substantially flat frequency response from zero to a first cut-off frequency, a hump-shaped rising and then falling frequency characteristic from the first cut-off frequency determined by the first impedance to a higher second cut-off frequency determined by the second impedance, and a continued substantial fall-off at higher frequencies above the second cut-off frequency; said first impedance being chosen to provide said rising frequency response near the first cut-off frequency; and said second impedance being chosen to provide the falling frequency response near said second cut-off frequency, whereby a frequency band of a reverberation sound produced by the apparatus is expanded to a relatively high frequency band and a damping factor remains relatively small, while near the upper cut-off frequency the falling response reduces a level of electromagnetic noise being generated.

* * * * *